United States Patent
Hsu

(10) Patent No.: US 9,265,166 B2
(45) Date of Patent: Feb. 16, 2016

(54) PARALLELISM CONTROL DEVICE APPLIED TO DUAL-SHAFT SYSTEM

(71) Applicant: FIRST DOME CORPORATION, New Taipei (TW)

(72) Inventor: An Szu Hsu, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

(21) Appl. No.: 14/225,599

(22) Filed: Mar. 26, 2014

(65) Prior Publication Data

US 2015/0245510 A1 Aug. 27, 2015

(30) Foreign Application Priority Data

Feb. 25, 2014 (TW) .............................. 103203197 U

(51) Int. Cl.
*E05D 3/12* (2006.01)
*H05K 5/02* (2006.01)
*F16H 57/021* (2012.01)
*F16H 25/06* (2006.01)
*E05D 11/00* (2006.01)
*E05D 11/08* (2006.01)

(52) U.S. Cl.
CPC ............... *H05K 5/0226* (2013.01); *E05D 3/12* (2013.01); *E05D 11/0054* (2013.01); *E05D 11/082* (2013.01); *F16H 25/06* (2013.01); *F16H 57/021* (2013.01); *E05D 2011/0072* (2013.01); *Y10T 16/533* (2015.01); *Y10T 16/547* (2015.01); *Y10T 16/5474* (2015.01)

(58) Field of Classification Search
CPC ..... G06F 1/1681; G06F 1/1618; G06F 1/162; G06F 1/1679; E05D 3/06; E05D 3/12; E05D 3/18; E05D 3/122; Y10T 16/54038; Y10T 16/547; Y10T 16/5474; Y10T 16/5478; Y10T 16/546; Y10T 16/544; Y10T 16/5443; Y10T 16/53864; Y10T 16/5387; Y10T 16/5398; Y10T 16/53987; Y10T 16/53988
See application file for complete search history.

(56) References Cited

U.S. PATENT DOCUMENTS

| | | | | |
|---|---|---|---|---|
| 4,200,957 A | * | 5/1980 | Hsu .................................. | 16/314 |
| 4,242,773 A | * | 1/1981 | Beigh ............................. | 16/371 |
| 5,666,694 A | * | 9/1997 | Slow et al. ...................... | 16/368 |
| 7,414,834 B2 | * | 8/2008 | Ukonaho et al. ......... | 361/679.55 |
| 7,512,426 B2 | * | 3/2009 | Maatta et al. ............... | 455/575.1 |
| 7,667,959 B2 | * | 2/2010 | Pelkonen ................. | 361/679.27 |
| 7,738,930 B2 | * | 6/2010 | Petrella ...................... | 455/575.3 |
| 7,765,644 B2 | * | 8/2010 | Ueyama et al. ................. | 16/354 |
| 7,900,323 B2 | * | 3/2011 | Lin ................................. | 16/366 |
| 7,930,803 B2 | * | 4/2011 | Ueyama et al. ................. | 16/366 |
| 8,474,101 B2 | * | 7/2013 | Wang et al. ..................... | 16/366 |
| 8,615,848 B2 | * | 12/2013 | Mitsui ............................ | 16/366 |

(Continued)

*Primary Examiner* — Jeffrey O Brien
(74) *Attorney, Agent, or Firm* — Rosenberg, Klein & Lee

(57) ABSTRACT

A parallelism control device applied to dual-shaft system for fixing the parallelism of the rotary shafts and facilitating the assembling process. The device includes an assembly of a first and a second rotary shafts and a fixing unit capable of providing torque effect. Each of the first and second rotary shafts has a fixed section and a pivoted section mounted on an electronic apparatus. The fixing unit has a substantially C-shaped cross section and includes a first and a second sections, a connection section in connection with the first and second sections and a split between the first and second sections. The first and second sections and the connection section are fixedly assembled with the pivoted sections of the first and second rotary shafts so as to avoid deflection of the first and second rotary shafts and fix the parallelism thereof.

12 Claims, 3 Drawing Sheets

(56) References Cited

U.S. PATENT DOCUMENTS

| | | | |
|---|---|---|---|
| 8,959,716 B2 * | 2/2015 | Hsu | 16/302 |
| 2006/0236505 A1 * | 10/2006 | Maatta et al. | 16/366 |
| 2006/0238970 A1 * | 10/2006 | Ukonaho et al. | 361/683 |
| 2007/0094846 A1 * | 5/2007 | Ishida | 16/354 |
| 2007/0226955 A1 * | 10/2007 | Cho et al. | 16/354 |
| 2008/0307608 A1 * | 12/2008 | Goto | 16/366 |
| 2009/0000062 A1 * | 1/2009 | Yamanami | 16/366 |
| 2009/0013500 A1 * | 1/2009 | Ueyama et al. | 16/354 |
| 2011/0157780 A1 * | 6/2011 | Wang et al. | 361/679.01 |
| 2011/0289726 A1 * | 12/2011 | Zhang et al. | 16/250 |
| 2012/0096678 A1 * | 4/2012 | Zhang et al. | 16/302 |
| 2013/0318746 A1 * | 12/2013 | Kuramochi | 16/342 |
| 2014/0290008 A1 * | 10/2014 | Hsu | 16/386 |
| 2015/0040353 A1 * | 2/2015 | Chen et al. | 16/366 |

* cited by examiner

PARALLELISM CONTROL DEVICE APPLIED TO DUAL-SHAFT SYSTEM

BACKGROUND OF THE INVENTION

1. Field of the Invention

The present invention relates generally to a parallelism control device applied to dual-shaft system, and more particularly to a parallelism control device, which is assembled with two rotary shafts of the dual-shaft system to help in fixing the parallelism of the rotary shafts and provide torque effect.

2. Description of the Related Art

There are various electronic apparatuses provided with covers or display screens, such as mobile phones, notebooks, PDA, and electronic books. The covers or display screens are pivotally mounted on the electronic apparatuses via pivot pins or rotary shafts, whereby the covers or display screens can be freely rotated and opened/closed under external force.

In order to operate the display module (such as the screen) and/or the apparatus body module of the electronic apparatus in more operation modes and application ranges, a dual-shaft mechanism is provided between the display module and the apparatus body module, whereby the display module and/or the apparatus body module can be operated in different operation modes by different rotational angles.

One end (or so-called pivoted end) of the rotary shaft structure is generally assembled with a torque module composed of multiple gaskets with through holes and recessed/raised locating sections, frictional plates and springs. Two ends of the rotary shafts are respectively fixedly assembled in a case by means of retainer rings or retainer plates. The other end (or so-called fixed end) of the rotary shaft structure is mounted on the apparatus body module and display module of the electronic apparatus. The springs cooperatively store and release energy to rotate and locate the rotary shafts. Basically, the structural design and assembling process of such rotary shaft structure is relatively complicated and the rotary shafts need to provide longer length for assembling with the torque module. Moreover, the recessed/raised locating sections of the gaskets and the frictional plates are subject to wear after a period of operation. This will affect the locating effect.

Also, when a user operates the display module of the apparatus body module to rotate the same, the rotational action force is applied to one end or fixed end of the rotary shaft to make the rotary shaft rotate. In this case, the other end or the pivoted end of the rotary shaft is likely to slightly deflect. As a result, the electronic apparatus can be hardly smoothly rotated and operated.

That is, the fixed end of the rotary shaft serves as a rotational support point of the action force for rotating the electronic apparatus. This will make the other end or the pivoted end of the rotary shaft deflected. As well known by those who are skilled in this field, in order to solve the above problem, it is necessary to assemble the retainer rings and the retainer plates at two ends of the rotary shaft with the rotary shaft and the case at high precision so as to keep the parallelism of the two rotary shafts and solve the problem of deflection of one end of the rotary shaft. Obviously, this will increase the difficulty in assembling and processing and thus increase the manufacturing cost. This is not what we expect.

The conventional pivot pin structures or rotary shaft structures and the relevant connection components thereof have some shortcomings in use and structural design that need to be overcome. It is therefore tried by the applicant to provide a parallelism control device applied to dual-shaft system to eliminate the shortcomings existing in the conventional rotary shaft structure so as to widen the application range. For example, in comparison with the conventional pivot pin structures or rotary shaft structures, the pivot pin or rotary shaft is assembled with the fixing/control device. In response to the rotation of the electronic apparatus, the fixing device can keep the parallelism of the rotary shafts and minimize the possibility of deflection of one end of the rotary shaft. Also, the torque module composed of the gaskets, the frictional plates and the springs is removed. The fixing/control device itself can provide torque effect to simplify the structure and facilitate the assembling process of the pivot pin or rotary shaft structure. Therefore, the length of the rotary shafts can be shortened and it is no more necessary to assemble the components of the rotary shaft structure at high precision.

SUMMARY OF THE INVENTION

It is therefore a primary object of the present invention to provide a parallelism control device applied to dual-shaft system for fixing the parallelism of the rotary shafts and facilitating the assembling process. The parallelism fixing device has a simplified structure and includes an assembly of a first rotary shaft, a second rotary shaft and a fixing unit capable of providing torque effect. Each of the first and second rotary shafts has a fixed section and a pivoted section mounted on an electronic apparatus. The fixing unit has a substantially C-shaped cross section and includes a first section in the form of a cantilever, a second section in the form of a cantilever, a connection section in connection with the first and second sections and a split between the first and second sections. The first and second sections and the connection section are fixedly assembled with the pivoted sections of the first and second rotary shafts so as to avoid deflection of the first and second rotary shafts due to external operational force and fix the parallelism thereof.

In the above parallelism control device applied to dual-shaft system, the fixing unit is defined with a central reference axis. The first and second sections of the fixing unit always provide an elastic action force toward the central reference axis. The split permits the first and second sections to be elastically biased.

In the above parallelism control device applied to dual-shaft system, the pivoted sections of the first and second rotary shafts are assembled with a link unit for synchronously rotating the first and second rotary shafts. The pivoted sections of the first and second rotary shafts are formed with drive sections drivingly engaged with the link unit. The first and second sections and the connection section together defining a belly section. The pivoted sections of the first and second rotary shafts are fixedly assembled in the belly section. The link unit is received in the belly section of the fixing unit.

The present invention can be best understood through the following description and accompanying drawings, wherein:

DETAILED DESCRIPTION OF THE PREFERRED EMBODIMENTS

Figure 1:
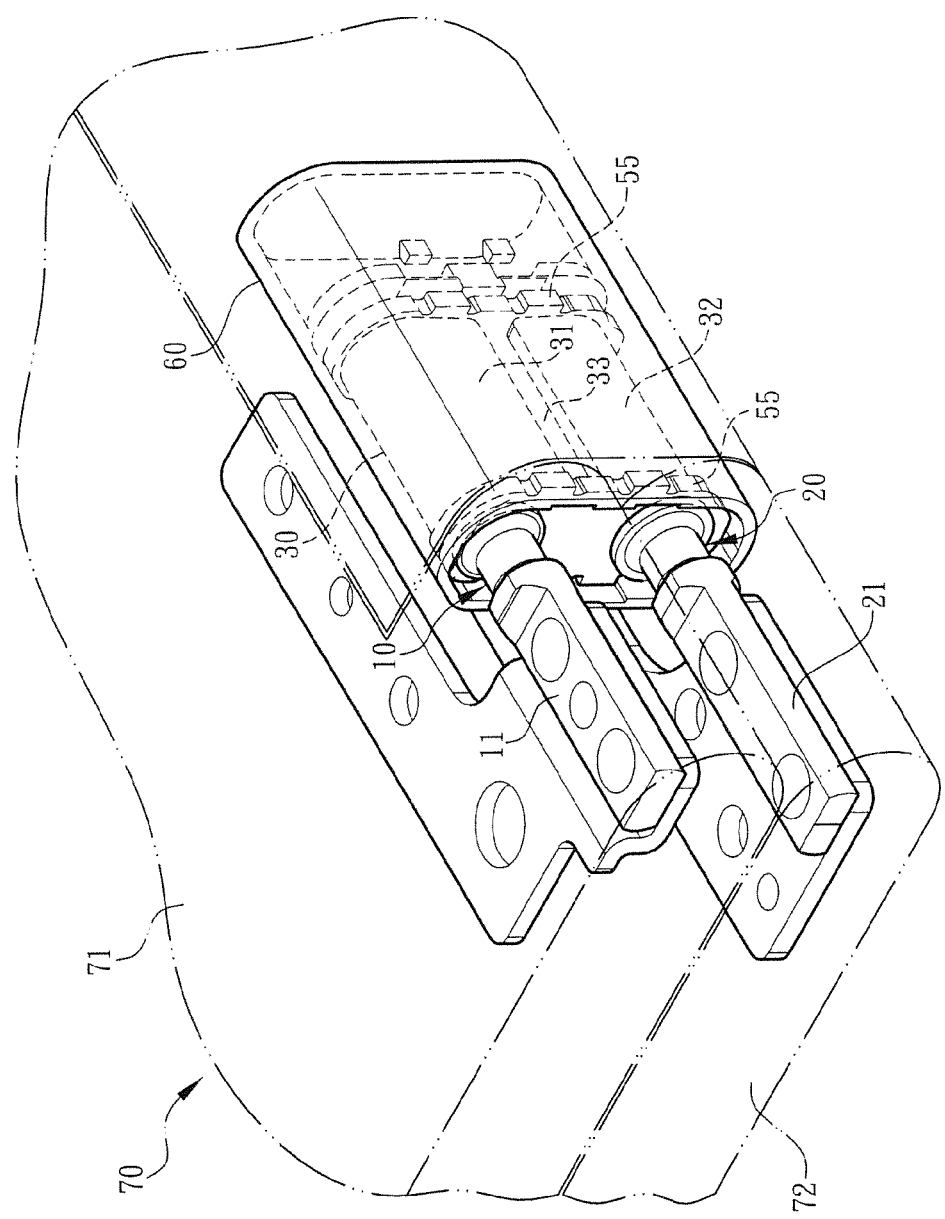
FIG. 1 is a perspective assembled view of the parallelism control device applied to dual-shaft system of the present invention, showing the cooperation between the first and second rotary shafts and the fixing unit.
Figure 2:
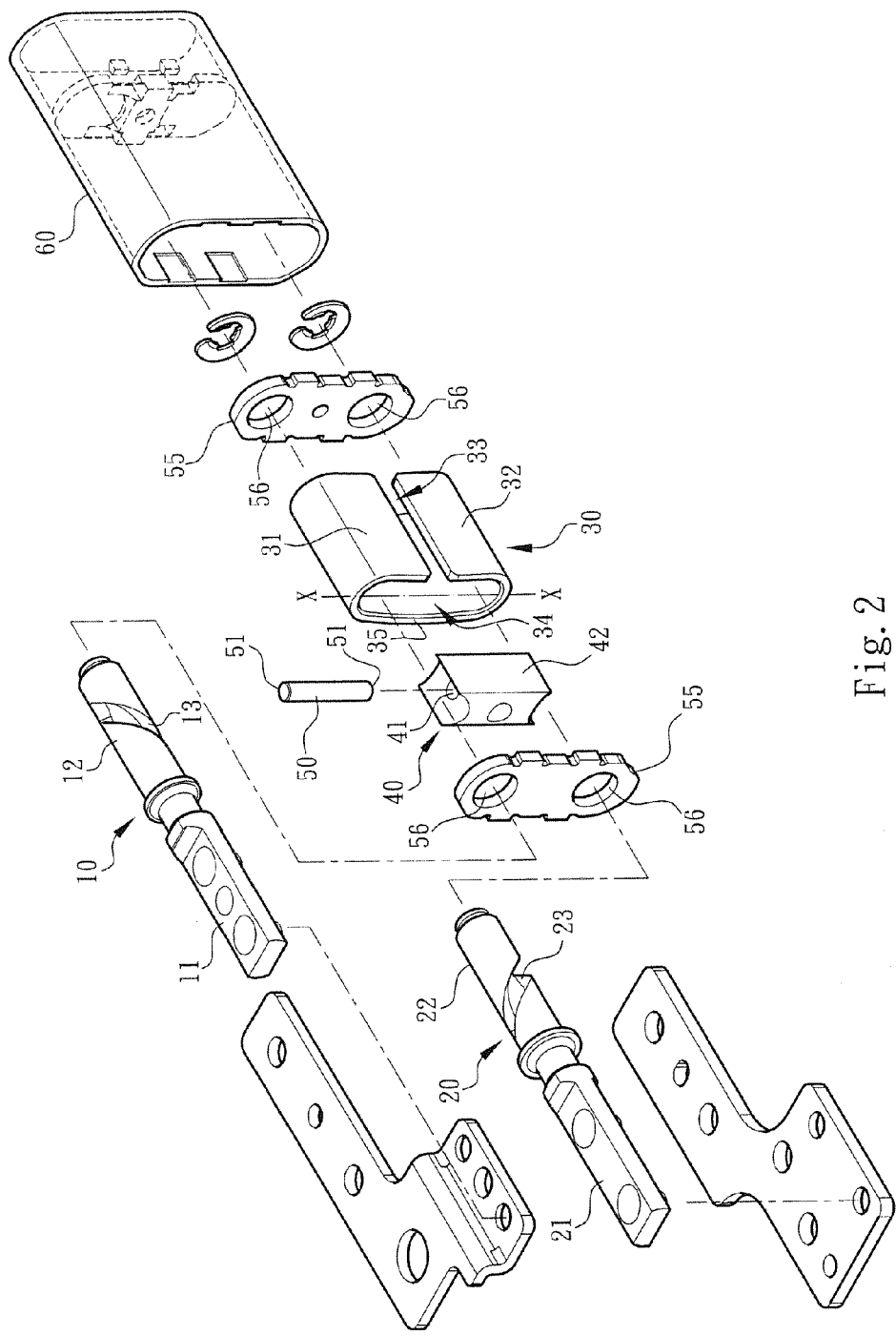
FIG. 2 is a perspective exploded view of the parallelism control device applied to dual-shaft system of the present invention, showing the structural form of the first and second rotary shafts and the fixing unit.
Figure 3:
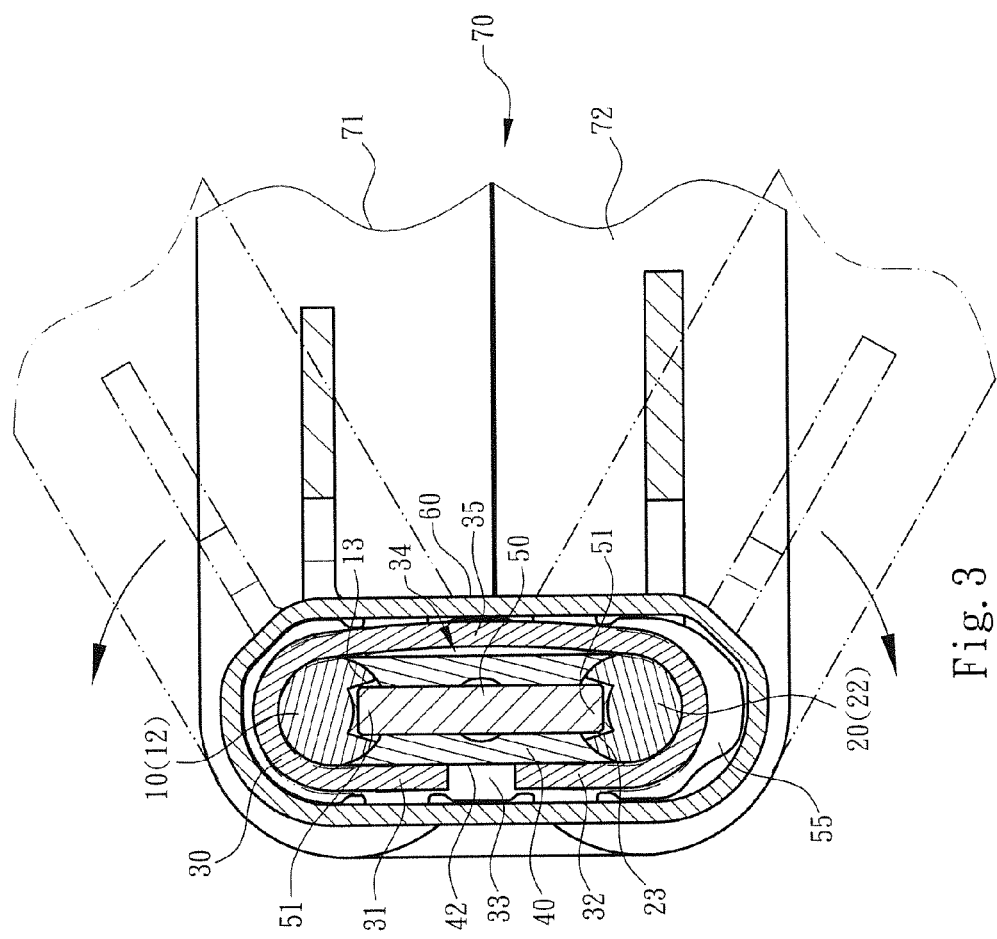
FIG. 3 is a plane sectional view of the parallelism control device applied to dual-shaft system of the present invention, showing that the fixing unit keeps the first and second rotary shafts having a good parallelism and the first and second sections of the fixing unit are elastically moved (expanded) when the first and second rotary shafts are synchronously rotated.

Please refer to FIGS. 1, 2 and 3. According to a preferred embodiment, the parallelism control device applied to dual-shaft system of the present invention is assembled with an electronic apparatus (such as a computer) for illustration purposes. The parallelism control device includes a first rotary shaft 10, a second rotary shaft 20 and a fixing unit 30, which are assembled with each other. Each of the first and second rotary shafts 10, 20 has a fixed section 11, 21 and a pivoted section 12, 22. The fixed section 11 of the first rotary shaft 10 is connected with and disposed on a display module 71 (such as a screen) of the electronic apparatus 70. The fixed section 21 of the second rotary shaft 20 is connected with and disposed on an apparatus body module 72 of the electronic apparatus 70.

As shown in FIGS. 1, 2 and 3, the fixing unit 30 is assembled with the pivoted sections 12, 22 of the first and second rotary shafts 10, 20. The fixing unit 30 is a casing structure with two open ends. The fixing unit 30 has a substantially C-shaped cross section. The fixing unit 30 is defined with a central reference axis χ. The fixing unit 30 includes a first section 31 in the form of a cantilever, a second section 32 in the form of a cantilever, a connection section 35 in connection with the first and second sections 31, 32 and a split 33 positioned between the first and second sections 31, 32. With the central reference axis χ as a reference, the connection section 35 is formed on one side of the fixing unit 30. The first and second sections 31, 32 and the connection section 35 together define a belly section 34. The pivoted sections 12, 22 of the first and second rotary shafts 10, 20 are fixedly assembled in the belly section 34.

In this embodiment, a link unit 40 is disposed between the pivoted sections 12, 22 of the first and second rotary shafts 10, 20 for synchronously rotating the first and second rotary shafts 10, 20. To speak more specifically, the pivoted sections 12, 22 of the first and second rotary shafts 10, 20 are formed with drive sections 13, 23. The drive sections 13, 23 are formed on the surfaces of the pivoted sections 12, 22 in the form of spiral groove. Corresponding to the drive sections 13, 23, the link unit 40 is formed with an assembling hole 41. A pin member 50 is assembled in the assembling hole 41. The pin member 50 has two ends 51 protruding from the assembling hole 41 of the link unit 40 and respectively inlaid in the drive sections 13, 23.

In another preferred embodiment, two raised sections can be directly formed at two ends of the link unit 40 and respectively inlaid in the drive sections 13, 23.

As shown in the drawings, the link unit 40 and the pin member 50 are enclosed in the belly section 34 of the fixing unit 30. When a user operates and rotates the display module 71, the first rotary shaft 10 is driven and rotated to force the link unit 40 to drive and rotate the second rotary shaft 20 and the apparatus body module 72.

As shown in FIGS. 1, 2 and 3, the pivoted sections 12, 22 of the first and second rotary shafts 10, 20 and the link unit 40 are enclosed in the fixing unit 30. Two ends of the fixing unit 30 respectively cooperate with two restriction plates 55 and the fixing unit 30 and the restriction plates 55 are together mounted in a case 60. Each restriction plate 55 is formed with two perforations 56 for the pivoted sections 12, 22 of the first and second rotary shafts 10, 20 to pass through. After the pivoted sections 12, 22 of the first and second rotary shafts 10, 20 pass through the belly section 34 of the fixing unit 30, the pivoted sections 12, 22 are assembled with the restriction plates 55 and the case 60.

It should be noted that the pivoted sections 12, 22 of the first and second rotary shafts 10, 20 are assembled with the restriction plates 55 and the first and second sections 31, 32 and the top end of the connection section 35 of the fixing unit touch and abut against the inner wall face of the case 60 to serve as the rotational support point of the pivoted sections 12, 22 of the first and second rotary shafts 10, 20. In addition, the pivoted sections 12, 22 are elastically enclosed in the fixing unit 30, whereby the pivoted sections 12, 22 of the first and second rotary shafts 10, 20 are elastically restricted to keep in parallel to each other. Accordingly, every section of the first and second rotary shafts 10, 20 is fastened, fixed or supported to provide the rotational torque for the first and second rotary shafts 10, 20. Therefore, when a user operates the display module 71 or the apparatus body module 72 to drive and rotate the fixed sections 11, 21 of the first and second rotary shafts 10, 20, the parallelism of the first and second rotary shafts 10, 20 can be kept stable without swinging. Moreover, the first and second sections 31, 32 of the fixing unit 30 always provide an elastic action force toward the central reference axis χ or one side 42 of the link unit. The split 33 permits the first and second sections 31, 32 to be elastically biased. Accordingly, the first and second sections 31, 32 of the fixing unit 30 provide an elastic fixing mechanism as the conventional torque module to help in locating the display module 71 or the apparatus body module 72 immediately after rotated.

The phantom lines of FIG. 3 especially show that when a user rotates the display module 71 or the apparatus body module 72 to drive the fixed sections 11, 21 of the first and second rotary shafts 10, 20 to rotate under the transmission of the link unit 40, the connection section 35 and the first and second sections 31, 32 of the fixing unit 30 provide an elastic (contraction) action force to press the link unit 40 so as to keep the link unit 40 in the belly section 34 to transmit the operation force of the user. This overcomes the problem of loosening of the rotary shaft assembly in operation/rotation of the electronic apparatus.

The parallelism control device applied to dual-shaft system of the present invention has the following advantages:

1. The rotary shafts and the relevant components are redesigned and different from the conventional device in use and operation form. In the conventional device, multiple engaged gears are employed to transmit the operational force or multiple gaskets and frictional plates and cooperative springs are used to store or release energy. For example, the pivoted sections 12, 22 of the first and second rotary shafts 10, 20 are assembled with the fixing unit 30. The fixing unit 30 has the first and second sections 31, 32 and the connection section 35 and the split 33 and the belly section 34. When the electronic apparatus 70 is operated and rotated, the parallelism of the rotary shafts can elastically keep fixed. In practice, during the rotation of the rotary shafts, the deflection of one end of the rotary shaft is minimized.

2. The pivoted sections 12, 22 of the first and second rotary shafts 10, 20 and the link unit 40 can be easily fixedly assembled with the first and second sections 31, 32 and the connection section 35 and the belly section 34 of the fixing unit 30 to form an elastic fixing structure as the torque module. Accordingly, the first and second rotary shafts 10, 20 (or the display module 71 and the apparatus body module 72) can be immediately located after rotated. In contrast, the conventional device has a complicated structure and is subject to wear and can be hardly smoothly synchronously rotated. Also, the fixing unit 30 can be easily assembled with the first and second rotary shafts 10, 20 so that it is no more necessary to assemble the components of the rotary shaft structure at high precision for keeping the parallelism of the rotary shafts. Also, the length of the rotary shafts can be shortened so that the difficulty in assembling and processing the components is minimized and the manufacturing cost is lowered.

In conclusion, the parallelism control device applied to the dual-shaft system of the present invention is different from and advantageous over the conventional device.

The above embodiments are only used to illustrate the present invention, not intended to limit the scope thereof. Many modifications of the above embodiments can be made without departing from the spirit of the present invention.

What is claimed is:

1. A parallelism control device applied to dual-shaft system, comprising:
   a first rotary shaft;
   a second rotary shaft; and
   a fixing unit capable of providing torque effect, the first and second rotary shafts being assembled with the fixing unit, each of the first and second rotary shafts having a fixed section and a pivoted section, the fixing unit being a casing structure with two open ends, the fixing unit being defined with a central reference axis, the fixing unit including a first section, a second section and a split positioned between the first and second sections, the fixing unit further including a connection section on one side of the central reference axis in connection with the first and second sections, the first and second sections and the connection section together defining a belly section, the pivoted sections of the first and second rotary shafts being fixedly assembled in the belly section;
   wherein the pivoted sections of the first and second rotary shafts are assembled with a link unit for synchronously rotating the first and second rotary shafts, the pivoted sections of the first and second rotary shafts being formed with drive sections drivingly engaged with the link unit, the link unit being received in the belly section of the fixing unit: and
   the fixing unit has a substantially C-shaped cross section, the first and second sections of the fixing unit being in the form of a cantilever, whereby the first and second sections of the fixing unit always provide an elastic action force toward the central reference axis, the split permitting the first and second sections to be elastically biased.

2. The parallelism control device applied to dual-shaft system as claimed in claim 1, wherein the drive sections are formed on surfaces of the pivoted sections in the form of spiral groove, corresponding to the drive sections, the link unit being formed with an assembling hole, a pin member being assembled in the assembling hole, the pin member having two ends protruding from the assembling hole of the link unit and respectively inlaid in the drive sections.

3. The parallelism control device applied to dual-shaft system as claimed in claim 1, wherein the drive sections are formed on surfaces of the pivoted sections in the form of spiral groove, corresponding to the drive sections, two raised sections being formed at two ends of the link unit and respectively inlaid in the drive sections.

4. The parallelism control device applied to dual-shaft system as claimed in claim 1, wherein the fixing unit encloses the pivoted sections of the first and second rotary shafts and the link unit, two ends of the fixing unit respectively cooperating with two restriction plates and the fixing unit and the restriction plates being together mounted in a case, each restriction plate being formed with two perforations for the pivoted sections of the first and second rotary shafts to pass through, after the pivoted sections of the first and second rotary shafts pass through the belly section of the fixing unit, the pivoted sections being assembled with the restriction plates and the case.

5. The parallelism control device applied to dual-shaft system as claimed in claim 2, wherein the fixing unit encloses the pivoted sections of the first and second rotary shafts and the link unit, two ends of the fixing unit respectively cooperating with two restriction plates and the fixing unit and the restriction plates being together mounted in a case, each restriction plate being formed with two perforations for the pivoted sections of the first and second rotary shafts to pass through, after the pivoted sections of the first and second rotary shafts pass through the belly section of the fixing unit, the pivoted sections being assembled with the restriction plates and the case.

6. The parallelism control device applied to dual-shaft system as claimed in claim 3, wherein the fixing unit encloses the pivoted sections of the first and second rotary shafts and the link unit, two ends of the fixing unit respectively cooperating with two restriction plates and the fixing unit and the restriction plates being together mounted in a case, each restriction plate being formed with two perforations for the pivoted sections of the first and second rotary shafts to pass through, after the pivoted sections of the first and second rotary shafts pass through the belly section of the fixing unit, the pivoted sections being assembled with the restriction plates and the case.

7. The parallelism control device applied to dual-shaft system as claimed in claim 1, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

8. The parallelism control device applied to dual-shaft system as claimed in claim 2, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

9. The parallelism control device applied to dual-shaft system as claimed in claim 3, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

10. The parallelism control device applied to dual-shaft system as claimed in claim 4, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

11. The parallelism control device applied to dual-shaft system as claimed in claim 5, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

12. The parallelism control device applied to dual-shaft system as claimed in claim 6, wherein the fixed sections of the first and second rotary shafts are connected with and disposed on an electronic apparatus, the electronic apparatus including a display module and an apparatus body module, the fixed section of the first rotary shaft being connected with and disposed on the display module, while the fixed section of the second rotary shaft being connected with and disposed on the apparatus body module.

* * * * *